United States Patent [19]

Roberts

[11] 4,422,056
[45] Dec. 20, 1983

[54] INTEGRATED MULTI-STAGE ELECTRICAL FILTER

[75] Inventor: Victor D. Roberts, Burnt Hills, N.Y.

[73] Assignee: General Electric Company, Schenectady, N.Y.

[21] Appl. No.: 305,819

[22] Filed: Sep. 28, 1981

[51] Int. Cl.³ .............................................. H03H 7/09
[52] U.S. Cl. ................................... 333/177; 315/239; 336/215; 333/185
[58] Field of Search ....................... 333/167, 176–177, 333/181, 184–185; 315/239, 276–279; 336/178, 212, 214, 215; 323/205–206, 208, 308–309, 332, 334, 901, 908

[56] References Cited

U.S. PATENT DOCUMENTS 2,380,522  7/1945  Haug ..................................... 333/206
2,436,925  3/1948  Haug et al. .
3,708,744  1/1973  Stephens et al. ............... 336/214 X Primary Examiner—Marvin L. Nussbaum
Attorney, Agent, or Firm—William H. Steinberg; James C. Davis, Jr.; Marvin Snyder

[57] ABSTRACT

A multi-legged transformer core is employed to integrate into a single structure the discrete magnetic components required to form a multiple stage inductor-capacitor filter. The device may be employed in low pass filters used with inverters to remove high order harmonic frequency signals. The filter of the present invention is particularly useful in discharge lamp ballast circuits.

3 Claims, 6 Drawing Figures

INTEGRATED MULTI-STAGE ELECTRICAL FILTER

BACKGROUND OF THE INVENTION

This invention relates to electrical multi-stage filter circuits and, more particularly, to inductor-capacitor filters employing integrated transformer-inductor magnetic components.

In electrical power conversion or power supply circuits, it is often necessary to perform high-speed switching operations on the power signal to make it easier to employ magnetic circuit components such as transformers for the proper conditioning of the power signal. In the process of the high-speed switching to accomplish this conditioning, undesirable high frequency and harmonic components are introduced into the power signal. Since these high frequency components may cause radiated electromagnetic interference, it is desirable to remove such components from the power signal. This is usually accomplished using a low pass filter.

Electronic power inverters such as those described above are particularly useful in powering arc discharge lamps. For example, such circuits may be found in the electronic ballasts for fluorescent lamps and for the more recently-developed solenoidal electric field (SEF) lamps. In such lamps, it is important that the ballast weight and cost be kept low. Conventional low pass filters are at least somewhat deficient in this respect. Additionally, since such lamps may be employed in a large number of locations, there is even further motivation to ensure a low level of electromagnetic interference.

Various forms of low pass filters are well known in the electrical and electronic arts. In particular, filters comprising inductor-capacitor ladder networks are well known. These ladder networks typically employ inductors as series elements and capacitors as shunt elements. The design cut-off frequency and frequency response characteristics of such filters are well known. In these ladder network low pass filters, the degree of high frequency attenuation desired is particularly controlled by the number of stages in the filter. However, in such filter arrangements it is necessary to provide a separate inductor for each stage. This not only adds weight but also cost to the filter.

The use of integrated inductor-transformers in a discharge lamp ballast circuit has also been well known in the past. In particular, it has been known that the use of a gapped leg in a multi-legged transformer core can effectively operate as a current-limiting inductor in an electronic gas discharge lamp ballast circuit. (See, for example, "Electric Discharge Lamps" by J. F. Weymouth, MIT Press, 1971), page 318. This concept is also disclosed in U.S. Pat. No. 4,187,450, issued Feb. 5, 1980 to DeYu Chen.

Additionally, it is to be noted that so-called constant voltage transformers have been employed in the past. However, these devices are described as including a capacitor connected across a transformer winding in such a way that the magnetic flux passing through this winding is the same as the flux passing through one of the transformer main (i.e., primary or secondary) windings. These capacitors therefore function as if they were connected across these main windings. The effective capacitance of such a capacitor is, of course, dependent on the turns ratio between the capacitor's winding and the main winding having the same magnetic flux.

SUMMARY OF THE INVENTION

In accordance with a preferred embodiment of the present invention, an integrated electrical filter comprises: a first magnetic flux loop path, in a relatively high magnetic permeability material, including a first gap exhibiting a relatively lower magnetic permeability and passing through at least a portion of a first winding; a second magnetic flux loop path in a relatively high magnetic permeability material, the second loop path including a second gap and a second winding; and a third such loop path in such material, the third path passing through at least a portion of a third winding connected across a capacitor, the third loop path also either passing through at least a portion of the first winding or including the first gap and the third loop path also either passing through at least a portion of the second winding or including the second gap.

A preferred embodiment of the present invention includes a core having two gapped legs with the third winding disposed on an ungapped portion of the core between the two gapped legs. The filter of the present invention may also include one or more extra ungapped legs for additional secondary output windings. The present invention is also readily extendable to filter circuits having a plurality of stages which are provided simply by adding transverse gapped legs with windings disposed on said core between said gapped legs with capacitive elements attached thereto. In the present invention, the need for multiple magnetic cores has been eliminated. This results in a savings not only in weight but also in cost.

Accordingly, it is an object of the present invention to provide an integrated multi-stage low pass filter.

It is a further object of the present invention to provide a filter for use in an electronic lamp ballast circuit having low weight and low cost.

Lastly, it is an object of the present invention to integrate the elements of a filter circuit containing inductive components into a single structure.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
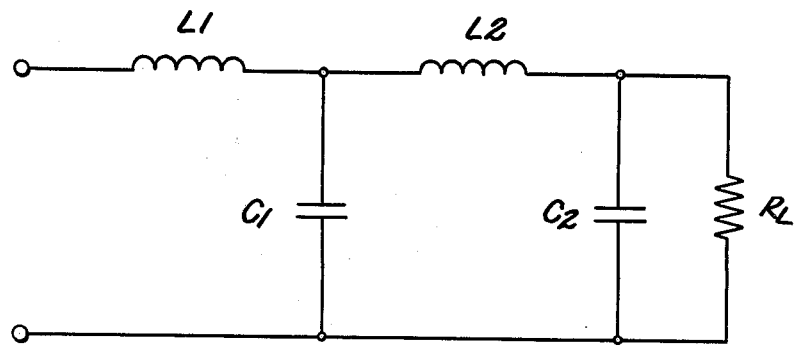
FIG. 1 is a schematic diagram of a conventional low pass filter conduit.

FIG. 1 illustrates a conventional two-stage low pass filter providing signal power to resistive load $R_L$. The filter comprises series inductors $L_1$ and $L_2$ with shunt capacitors $C_1$ and $C_2$. In accordance with well known filter design principles, the values of these capacitors and inductors are selected to determine the desired cut-off frequency and frequency attenuation characteristics. This circuit is similar to FIG. 4 except that transformer core with primary winding 11 and secondary winding 12 is not shown. The circuit shown in FIG. 1 is desirable for removing high frequency components from power signals. However, it suffers from the disadvantage that two separate magnetic elements are required. Two magnetic cores must be provided.

Figure 2:
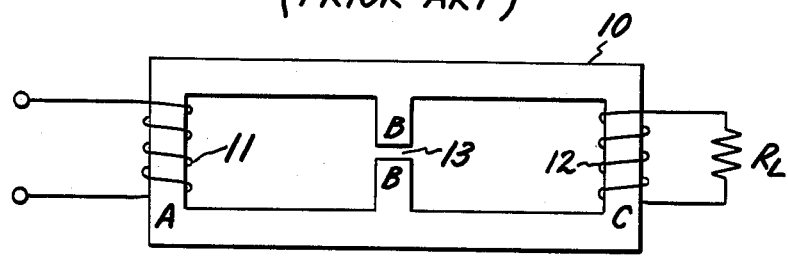
FIG. 2 is a schematic diagram illustrating the conventional integrated inductor-transformer arrangement employed in discharge lamp ballast circuits.

FIG. 2 illustrates a transformer core 10 with vertical gapped leg B and vertical ungapped legs A and C. The structure in FIG. 2 is essentially a transformer with primary input winding 11 and secondary output winding 12 connected across load $R_L$. This is a circuit which has been proposed by some for use in electronic lamp ballast circuits because gapped leg B acts as a current-limiting inductor. This is important in discharge lamp circuits since such lamps exhibit a negative current characteristic and means must be provided in the ballast circuit for limiting load current. As used here and in the appended claims, a magnetic core is said to have a gapped leg if there is an interruption in the magnetic material of the core leg or if the magnetic flux path includes a material having relatively lower magnetic permeability. This interruption may include air or other material having a lower magnetic permeability than that of the core material. If a leg has no such gap, it is referred to herein and in the appended claims as non-gapped leg. However, it is well recognized in the transformer arts that such structures as are shown in FIGS. 2, 3, 5 and 6 are generally constructed using several pieces such as I-shaped members, E-shaped members or U-shaped members. Such construction schemes result in a very small gap in legs referred to herein as being ungapped. However, these small, parasitic gaps do not effect, in any significant way, the performance or functioning of the filters of the present invention. Such legs with these parasitic gaps are also referred to herein as being ungapped.

Figure 3:
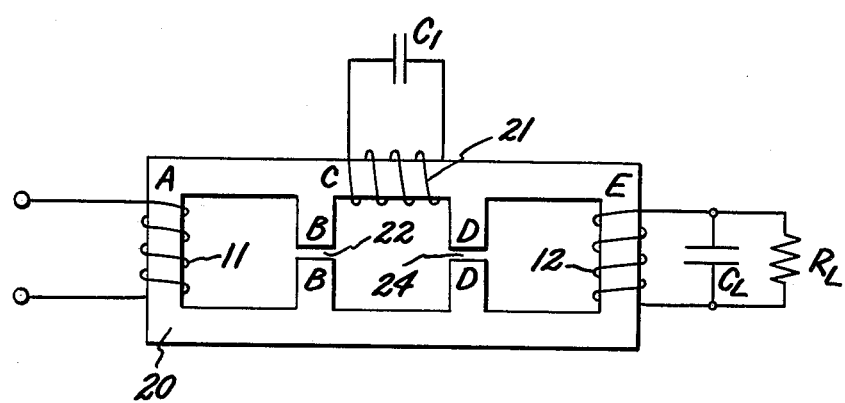
FIG. 3 is a schematic diagram of the present invention showing a two-stage integrated filter circuit.
Figure 4:
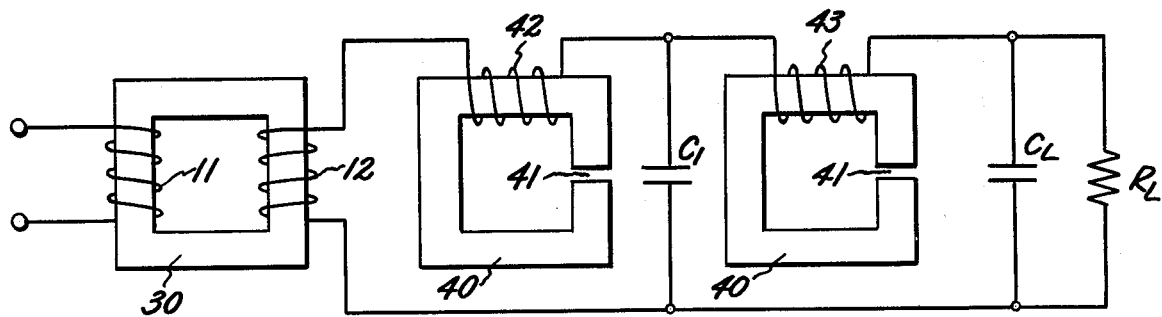
FIG. 4 is a schematic diagram illustrating a circuit equivalent to that shown in FIG. 3 but employing a greater number of magnetic circuit components.

FIG. 3 illustrates one embodiment of the present invention in which the integrated multi-stage filter is a two-stage, low pass filter. In particular, core 20 includes ungapped legs A and E around which primary winding 11 and scondary winding 12, respectively, are disposed. Core 20 also includes gapped legs B and D with gaps 22 and 24, respectively. Lying between gapped legs B and D is a series-connected portion C of core 20. Winding 21 is disposed about core portion C and capacitor $C_1$ is connected across winding 21. The secondary winding is connected across load $R_L$ which may include an intrinsic capacitance $C_L$. Alternatively, $C_L$ may be added as part of the present invention to either augment any capacitive impedance in the load or to provide a capacitive impedance, if not already present, and if desired. A significant advantage of the filter circuit shown in FIG. 3 is that only a single magnetic component, namely core 20, is required. A separate transformer and inductors, as seen in FIG. 4, are not required.

It should be noted for the purposes of the present invention that the relative positions of legs A and B are immaterial. Thus the positions of these legs could be interchanged without affecting the essential operation of the present invention. Put another way, leg B could be ungapped with a winding while leg A was gapped but without a winding. The same is true for legs D and E.

Referring to FIG. 3, the filter of the present invention operates in the following manner. Magnetic flux flowing in leg A is equal to the sum of the flux flowing in leg B and in core portion C, while the flux in core portion C is equal to the sum of the flux flowing in leg D and leg E. The voltage per turn on any winding is proportional to the time derivative of the magnetic flux through that winding. It is seen that leg D functions as an integrated inductor with respect to core portion C and leg E. Under no-load conditions, all the flux from core portion C flows through leg E. As the load current is increased, a portion of the flux from core portion C is shunted through leg D, reducing the voltage developed in the output winding. The inductor formed by leg D is, therefore, in series with the load connected to the output winding on leg E. When a capacitor is placed across the output load, or across another winding wound on leg E, an inductive-capacitive filter is formed. For a proper understanding of the present invention, it is important to note that the invention operates in the manner described because of the inclusion of the winding on core portion C with capacitor $C_1$ and because of the additional gapped leg B. The flux flowing through core portion C is equal to the sum of the magnetic flux flowing through legs D and E. Therefore, the voltage developed on the core portion C winding 21 is equal to the sum of the "inductor voltage" from leg D and the output voltage from leg E, which means that capacitor $C_1$ is in parallel with the series circuit formed by the output inductor leg D and the load $R_L$ and $C_L$.

Additionally, it is noted that the flux from core portion A divides between leg C and gapped leg B which acts and a second integrated inductor. The inductance formed by leg B is, therefore, in series with the parallel capacitor formed on core portion C. This series combination is driven by magnetic flux and, therefore, by the voltage across winding 11 on leg A. The device shown in FIG. 3, therefore, performs all the functions of the separate conventional components shown in FIG. 4.

While FIG. 3 shows the essential construction of one embodiment of the present invention, it is well appreciated by those skilled in the electrical arts that portions of windings 11, 21 and 12 may be located on legs other than those shown without substantially affecting the operation of the present invention.

However, FIG. 4 requires three times as may separate magnetic circuit elements. In particular, a transformer comprising core 30 with primary winding 11 and secondary winding 12 is connected to a conventional two-stage inductor-capacitor filter in which the first inductor comprises gapped core 40 with winding 42 and gap 41. Capacitor $C_1$ is a shunt capacitor and a second inductance is provided using another core 40 with a gapped leg and winding 43 as just described. Likewise, capacitor $C_L$ is provided as a shunt capacitor in parallel with load $R_L$. It is, therefore, seen that the conventional multi-stage filter shown in FIG. 4 requires more magnetic circuit elements than is necessary.

Figure 5:
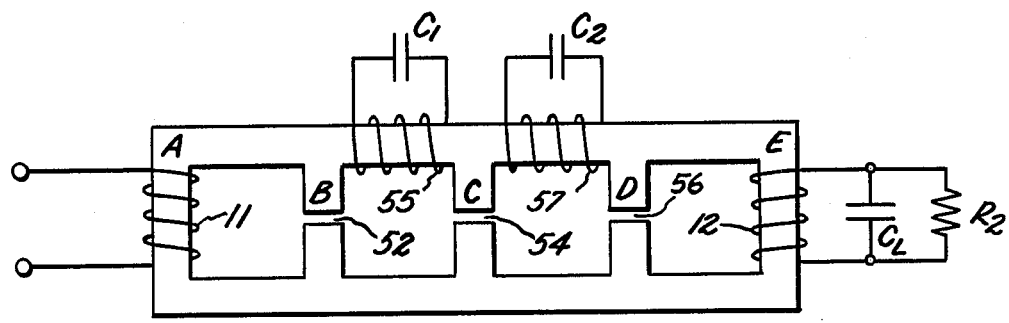
FIG. 5 is a schematic diagram illustrating a three-stage filter conduit.

FIG. 5 illustrates a multi-stage filter circuit in accordance with the present invention in which three filter stages are provided. It can be seen, by comparing FIGS. 3 and 5, that the extension to an even larger number of stages is readily accomplished by inclusion of a transverse gapped leg and a winding disposed on a connecting portion of the magnetic core. This winding, of course, includes a capacitive element connected across it to provide the shunt capacitance desired. In particular, FIG. 5 illustrates core 50 with primary winding 11 disposed on ungapped leg A and secondary winding 12 disposed on ungapped leg E. Disposed between ungapped legs A and E are gapped legs B, C and D, as shown, with gaps 52, 54 and 56, respectively. Because gapped legs B and C winding 55 with capacitor $C_1$ is disposed on a series-connected ungapped portion of core 50. Between gapped legs C and D winding 57 is similarly disposed with capacitor $C_2$ connected across it. Also as discussed above, capacitor $C_L$ may be provided across winding 12 in parallel with load $R_L$. Thus, this circuit operates as a three-stage low pass filter and transformer including only a single magnetic core element.

Figure 6:
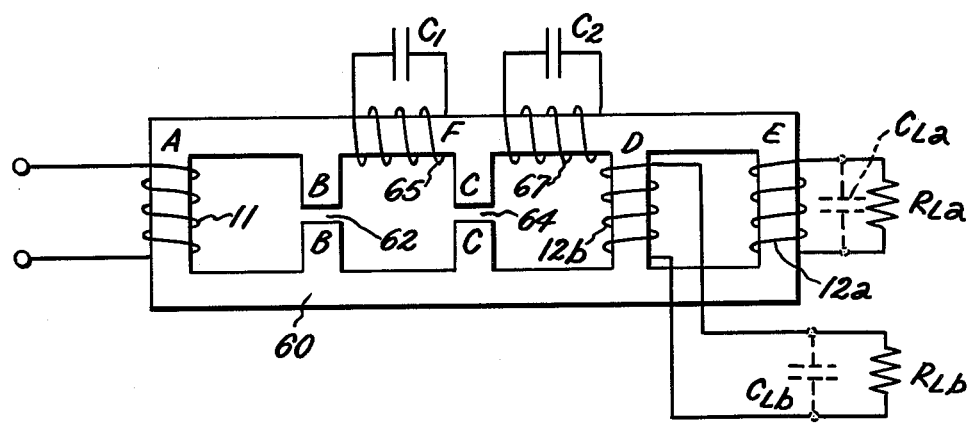
FIG. 6 is a schematic diagram similar to FIG. 3 in which two loads are driven.

FIG. 6 illustrates an integrated multi-stage low pass filter in accordance with the present invention which is similar to that shown in FIG. 3 except that the circuit of FIG. 6 drives multiple loads, $R_{La}$ and $R_{Lb}$. In particular leg D of core 60 now comprises an ungapped leg with a second secondary winding 12b connected to the second load. A first primary winding 12a is disposed around leg E of core 60 and is connected to load $R_{La}$, as shown. Load capacitors $C_{La}$ and $C_{Lb}$ may be provided across the respective loads, as shown. These capacitors may be provided either to introduce or augment load capacitance. Thus the circuit in FIG. 6 shows an integrated magnetic device combining a two-stage inductor-capacitor filter and a multiple load transformer for driving two isolated, series-connected loads as is more particularly disclosed in pending application Ser. No. 292,324 assigned to the same assignee as the present invention. Furthermore, it should be noted that capacitor $C_2$ functions as if a certain capacitance were connected in parallel with the series combination of the two loads.

From the above it may be appreciated that the present invention provides an integrated multi-stage filter in which the magnetic elements are combined in a single structure to reduce both weight and cost. It is also seen that the present invention is also extendable to filters having an arbitrary number of stages. The filter of the present invention is also amenable to conventional filter circuit design methods such as those employed in constructing the well known Butterworth and Chebyshev filters.

While the invention has been described in detail herein, in accord with certain preferred embodiments thereof, many modifications and changes therein may be affected by those skilled in the art. Accordingly, it is intended by the appended claims to cover all such modifications and changes as fall within the true spirit and scope of the invention.

The invention claimed is:

1. An integrated electrical filter employing magnetic components comprising:
   a closed magnetic loop multi-legged core having a first pair of legs comprising one gapped leg and one ungapped leg and a second pair of legs comprising one gapped leg and one ungapped leg, said first pair of legs positioned adjacent said second pair of legs on said core and connected to one another by series connected portions of the core;
   a first winding disposed on the ungapped leg in said first pair of legs;
   a second winding disposed on the ungapped leg in said second pair of legs;
   a third winding disposed on one of said series connected core portion joining said first pair of legs to said second pair of legs; and
   a capacitor connected across said third winding.

2. An integrated electrical filter employing magnetic components comprising:
   a closed magnetic loop multi-legged core having a first pair of legs comprising one gapped leg and an ungapped leg, a second pair of legs comprising one gapped leg and one ungapped leg and at least one additional gapped leg, said first pair of legs positioned on either side of said at least one ungapped leg, said first pair of legs connected to said gapped leg by series connected portions of said core and said second pair of legs connected to said gapped leg by series connected portions of said core;
   a first winding disposed on the ungapped leg in said first pair of legs;
   a second winding disposed on the ungapped leg in said second pair of legs;
   a third winding disposed on one of said series connected core portions joining said first pair of legs to said at least one ungapped leg;
   a capacitor connected across said third winding;
   a fourth winding disposed on one of said core portions joining said second pair of legs to said at least one ungapped leg; and
   a capacitor connected across said fourth winding.

3. The filter of claim 2 wherein said first winding comprises a primary winding, said second winding comprises a secondary winding, said second pair of legs further comprising an additional ungapped leg, and a fourth winding disposed on said additional ungapped leg providing a second secondary winding.

* * * * *